US006891268B2

(12) United States Patent
Tomiya et al.

(10) Patent No.: US 6,891,268 B2
(45) Date of Patent: May 10, 2005

(54) NITRIDE SEMICONDUCTOR LASER

(75) Inventors: Shigetaka Tomiya, Tokyo (JP); Tomonori Hino, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/343,878

(22) PCT Filed: Jun. 4, 2002

(86) PCT No.: PCT/JP02/05509

§ 371 (c)(1),
(2), (4) Date: Jul. 3, 2003

(87) PCT Pub. No.: WO02/099942

PCT Pub. Date: Dec. 12, 2002

(65) Prior Publication Data

US 2004/0012011 A1 Jan. 22, 2004

(30) Foreign Application Priority Data

Jun. 5, 2001 (JP) ....................................... 2001-169440

(51) Int. Cl.[7] ......................... H01L 23/48; H01L 29/40; H01L 21/00

(52) U.S. Cl. ......................... 257/744; 257/745; 438/46; 438/962

(58) Field of Search ................................ 257/744, 745, 257/12; 438/40, 45, 46, 506

(56) References Cited

U.S. PATENT DOCUMENTS 5,625,202 A * 4/1997 Chai ........................... 257/94
5,744,829 A * 4/1998 Murasato et al. ............. 257/94
5,834,331 A * 11/1998 Razeghi ........................ 438/40
6,043,514 A * 3/2000 Teraguchi ..................... 257/94
6,060,335 A * 5/2000 Rennie et al. ................ 438/46
6,160,833 A * 12/2000 Floyd et al. .................. 372/96
6,218,280 B1 * 4/2001 Krylíouk et al. ............ 438/607
6,233,265 B1 * 5/2001 Bour et al. .................... 372/45
6,258,619 B1 * 7/2001 Sonobe et al. ................ 438/47
6,350,666 B2 * 2/2002 Kryliouk ..................... 438/604
6,495,852 B1 * 12/2002 Mouri ......................... 257/21
6,566,677 B2 * 5/2003 Kano et al. ................... 257/15
2004/0051108 A1 * 3/2004 Nortrup ....................... 257/82

FOREIGN PATENT DOCUMENTS

| | | |
|---|---|---|
| EP | 1018770 A1 | 7/2000 |
| JP | 03-265122 | 11/1991 |
| JP | 10-084132 | 3/1998 |
| JP | 2000-077783 | 3/2000 |
| JP | 2000-114599 | 4/2000 |
| JP | 2000-332295 | 11/2000 |

* cited by examiner

*Primary Examiner*—Howard Weiss
*Assistant Examiner*—Shrinivas Rao
(74) *Attorney, Agent, or Firm*—Sonnenschein, Nath & Rosenthal LLP

(57) ABSTRACT

The present invention is a nitride compound semiconductor laser, in which a cleaved end face is flat, and a breakdown of a laser end face induced during an operation can be suppressed, which consequently enables a life to be prolonged. In the nitride compound semiconductor laser, a stress concentration suppression layer is formed between an active layer and a cap layer.

22 Claims, 6 Drawing Sheets

13 12 11 10 9 8 47 7 6 14 4 5 3 2 1

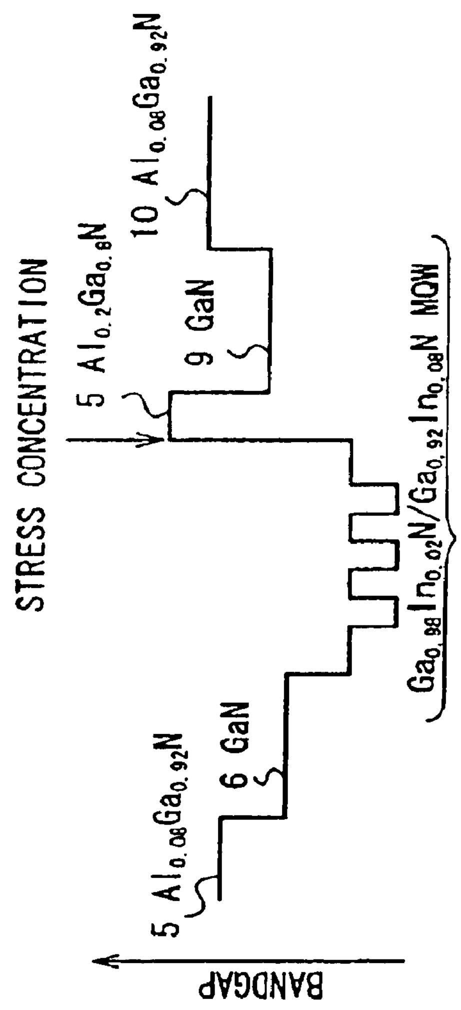
Fig. 4A
RELATED ART
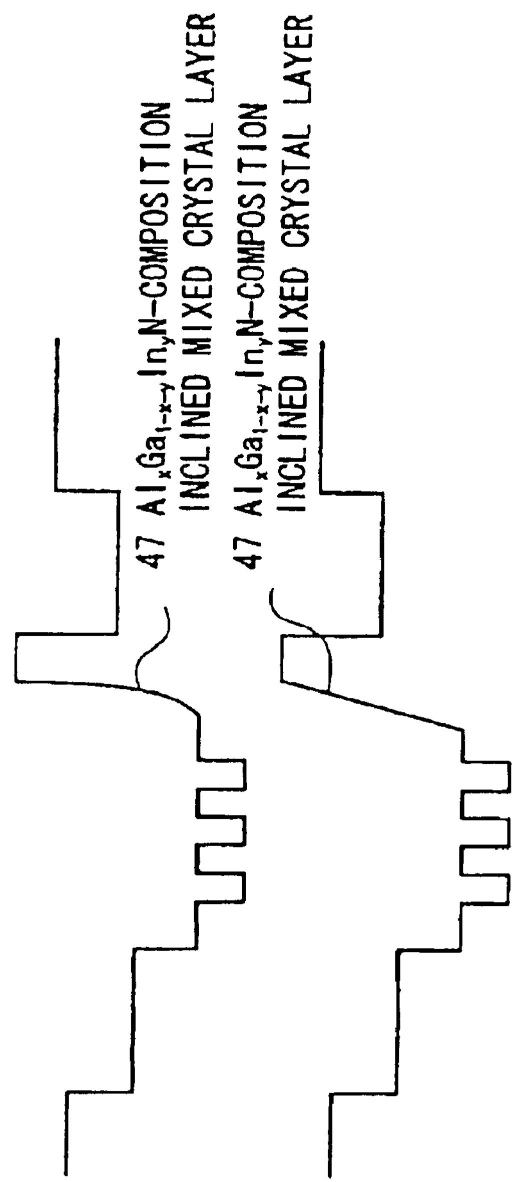
Fig. 4B
Fig. 4C

NITRIDE SEMICONDUCTOR LASER

BACKGROUND OF THE INVENTION

The present invention relates to a nitride semiconductor laser characterized by having a stress concentration suppressing layer between an active layer and a cap layer.

BACKGROUND ART

A GaN-based group III–V compound semiconductor (hereafter, referred to as a GaN-based semiconductor), which is a direct transition semiconductor whose forbidden band gap is in a range from 1.9 eV to 6.2 eV, enables a realization of a semiconductor light emitting device, such as a semiconductor laser diode (LD), a light emitting diode (LED) and the like, in which a light emission can be obtained from a visible region to a ultraviolet region. Thus, in recent years, development in the field has been vigorously advanced. Among them, actual usage of a blue-violet semiconductor LD from which a light having a light emission wavelength of about 400 nm is obtained is especially required in order to improve a recording density of an optical disc or the like, in a field of an optical recording. Also, a blue semiconductor LD having a light emission wavelength of about 460 nm is expected to be applied to a laser display. Moreover, an ultraviolet semiconductor LD having a light emission wavelength of 380 nm or less is expected to be applied to a light source for phosphor excitation.

Those GaN-based semiconductor light emitting devices are typically provided with GaN-based semiconductors grown on a substrate. Conventionally, as the substrate on which this GaN-based semiconductor is grown, there is no proper substrate having an excellent lattice matching property with GaN. Thus, a sapphire substrate is mainly used. However, a lattice mismatching with the GaN and a thermal expansion coefficient difference from it are very large. In this way, when the lattice matching with the substrate is poor and the thermal expansion coefficient difference from the substrate is large, influence on a crystallinity of a GaN-based semiconductor layer grown on the substrate is severe. Hence, a large quantity of dislocations, such as on an order of $10^8$ to $10^{10}/cm^2$, is implanted into the CaN-based semiconductor layer in order to relax that distortion. Among them, a threading dislocation especially transmitted in a thickness direction of a film is harmful for an active layer of a device formed near a film surface, and it acts as a current leakage portion and a non-light-emission center. So, threading dislocation is known to damage electrical and optical properties of the device.

Thus, in order to manufacture the GaN-based semiconductor device, threading dislocation must be reduced as much as possible. In recent years, as a method of reducing threading dislocation, an epitaxial growth method has been employed which uses a lateral direction growth, which is represented by an ELO (Epitaxial Lateral Overgrowth) method. The present inventors have employed the ELO method and tried to reduce a dislocation density of a GaN epitaxial film. At that time, the dislocation density within a Wing portion (a portion resulting from the lateral direction growth) under an optimized condition could be reduced to an order of about $10^6/cm^2$ or less. As a result, in the above-described GaN-based semiconductor laser manufactured by the present inventors, it was evident that a device life was improved by such as about 200 hours under conditions of 50° C. and 30 mW.

However, even in the case of the above-mentioned GaN-based semiconductor laser, it is difficult to say that those results can be sufficiently attained in actual usage. There is a margin for further improvement so as to improve the device life.

A subject of the present invention is to provide a nitride semiconductor laser, in which a cleaved end surface is flat, and a breakdown of a laser end surface induced during operation can be suppressed, resulting in a long life.

SUMMARY OF THE INVENTION

After a nitride semiconductor laser end surface was degraded and analyzed by using a scanning electron microscope (SEM), a transmission electron microscope (TEM) and the like, the present inventors found that the usage of the laser caused the breakdown in the vicinity of the active layer of the laser end surface, and discovered that this was one of the main reasons for the degradation of the nitride semiconductor laser.

After carrying out an eager discussion to solve the above-mentioned degradation reasons in view of such knowledge, the present inventors obtained an idea that the implantation of a stress concentration suppressing layer between an active layer and a cap layer enables the breakdown in the vicinity of the active layer on the laser end surface caused by the usage to be suppressed, which can improve the life of the nitride semiconductor laser.

More specifically, by having the lattice constant graded and the composition of the stress concentration suppressing layers from an active layer side to a cap layer side within the layers, so that the lattice constant and the composition of the active layer are smoothly changed to those within the cap layer, it is possible to suppress the stress concentration in the boundary between the active layer and the cap layer. Consequently, there were obtained unexpected ideas that the semiconductor laser whose cleaved end face is flat can be obtained, that the end face degradation breakdown induced during operation can be avoided, and that the life of the nitride semiconductor laser can be improved.

The course followed to obtain the above-mentioned idea will be described below in detail. The present inventors investigated in detail the breakdown situation of the laser end surface after the degradation. FIG. 2 shows a diagrammatic view of a section parallel to stripes of a front end face. An end face breakdown 16 was induced on a front end face 15 so that a crystal was scooped away in the vicinity of an active layer 7. This scooping of the crystal was the largest in the boundary between the active layer 7 and a cap layer 8.

Also, the condition of the end face before the deterioration of the semiconductor laser was investigated in detail by using the TEM and the like. FIG. 3 shows a diagrammatic view of the section parallel to the stripes of the front end face. The possible case of the introduction of a step 17 of about several nm or less in the boundary between the active layer 7 and the cap layer 8 was discovered on the front end face 15.

The above-mentioned stage difference 17 was induced so that the stress concentration caused by the lattice mismatching between the crystals of the active layer 7 and the cap layer 8 was relaxed. Then, the possibility that the step 17 and the excessive stress concentration in the boundary between the active layer 7 and the cap layer 8 caused the end face breakdown 16 to be especially centrally induced in the boundary between the active layer 7 and the cap layer 8.

More specifically, the active layer 7 is constituted by a multiple quantum well (MQW) structure in which a composition of a well layer is $Ga_{0.92}In_{0.08}N$ and a composition of a barrier layer is $Ga_{0.98}In_{0.02}N$, and the cap layer comprises a mixed crystal of $Al_{0.15}Ga_{0.85}N$. The lattice mismatchings between the a-axis of the GaN and the free standing mixed crystals of the $Ga_{0.92}In_{0.08}N$, the $Ga_{0.98}In_{0.02}N$ and the $Al_{0.15}Ga_{0.85}N$ are +0.889%, +0.222% and −0.358%, respectively. That is, in the boundary from the active layer 7 to the cap layer 8, the lattice mismatching with the GaN is sharply changed from a plus to a minus, which results in the densest concentration of the stress.

On the basis of the discussion result as mentioned above, the present inventors obtained the following knowledge. That is, by suppressing the excessive stress concentration caused by the lattice mismatching between the cap layer and the active layer in the vicinity of the active layer 7, it is possible to manufacture the semiconductor laser in which the step 17 does not substantially exist in the boundary between the active layer 7 and the cap layer 8, namely, the semiconductor laser in which the cleaved end face is flat. Also, the end face degradation breakdown induced during the operation can be avoided by suppressing the excessive stress concentration in the vicinity of the active layer on the above-mentioned laser end face and by making the cleaved end face flat.

Moreover, the present inventors eagerly discussed a specific method to suppress the excessive stress concentration in the vicinity of the active layer. Then, there was obtained an idea that the excessive stress concentration in the vicinity of the active layer can be suppressed by inserting a stress concentration suppression layer constituted by an $Al_xGa_{1-x-y}In_yN$ (1>x>0, 1>y>0 and 1>x+y>0) mixed crystal layer between the active layer and the cap layer, and by making its composition on the active layer side equal to the composition of the barrier layer of the active layer, namely, the $Ga_{0.98}In_{0.02}N$, and on the other hand, by making its composition on the cap layer side equal to the composition of the cap layer, namely, the $Al_{0.15}Ga_{0.85}N$, and then by having the composition of the stress concentration suppression layer graded so as to be smoothly changed from the active layer side to the cap layer side.

This will-be described below in detail with reference to a diagrammatic view of a band structure in the vicinity of the active layer shown in FIGS. 4A to 4C. FIG. 4A shows the diagrammatic view of the band structure in the vicinity of the active layer of the conventional nitride semiconductor laser. In the conventional nitride semiconductor laser, the band gap between the active layer 7 and the cap layer 8 is large as mentioned above, and the stress concentration is induced in the boundary between the active layer 7 and the cap layer 8. On the contrary, FIGS. 4B and 4C show the diagrammatic views of the band structure in the vicinity of the active layer of the nitride semiconductor laser according to the present invention. In the nitride semiconductor laser according to the present invention, provision of a stress concentration suppression layer 47 formed as mentioned above enables the smooth connection from the active layer 7 to the cap layer 8, which is evident from FIGS. 4B and 4C, and thereby enables the suppression of the excessive stress concentration in the vicinity of the active layer.

The present inventors further repeated the discussion and completed the present invention.

That is, the present invention relates to:

(1) a nitride semiconductor laser characterized by having a stress concentration suppressing layer between an active layer and a cap layer;

(2) a nitride semiconductor laser according to the above-mentioned item (1), characterized in that the stress concentration suppressing layer has a function of relaxing a change in a band gap between the active layer and the cap layer;

(3) a nitride semiconductor laser according to the above-mentioned item (1), characterized in that the stress concentration suppressing layer has, on an active layer side, the same composition as the active layer, and on a cap layer side, the same composition as the cap layer, and the composition of the stress concentration suppression layer is inclined to the cap layer side from the active layer side; and (4) a nitride semiconductor laser according to the above-mentioned item (3), characterized in that the composition on the active layer side of the stress concentration suppressing layer has the same composition as a barrier layer of an active layer having a multiple quantum well structure.

Also, the present invention relates to:

(5) a nitride semiconductor laser according to the above-mentioned item (2), characterized in that it has an n-type cladding layer on a side opposite to the stress concentration suppressing layer of the active layer, and has a p-type cladding layer on a side opposite to the stress concentration suppression layer of the cap layer, and in that a band gap of the active layer is smaller than band gaps of the above-mentioned n-type and p-type cladding layers, and a band gap of the cap layer is larger than the band gap of the p-type cladding layer;

(6) a nitride semiconductor laser according to the above-mentioned item (5), characterized in that the n-type cladding layer comprises an n-type AlGaN mixed crystal containing Si as n-type impurities, and the p-type cladding layer comprises a p-type AlGaN mixed crystal containing Mg as p-type impurities;

(7) a nitride semiconductor laser according to the above-mentioned item (5), characterized in that an n-type optical guiding layer is further formed between the active layer and the n-type cladding layer, and a p-type optical guiding layer is further formed between the p-type cladding layer and the cap layer;

(8) a nitride semiconductor laser according to the above-mentioned item (7), characterized in that the n-type optical guiding layer comprises an n-type GaN containing Si as n-type impurities, and the p-type optical guiding layer comprises a p-type GaN containing Mg as p-type impurities;

(9) a nitride semiconductor laser according to the above-mentioned item (7), characterized in that an n-type contact layer is further formed on a side opposite to the n-type optical guiding layer of the n-type cladding layer, and a p-type contact layer is further formed on a side opposite to the p-type optical guiding layer of the p-type cladding layer; and

(10) a nitride semiconductor laser according to the above-mentioned item (9), characterized in that the n-type contact layer comprises an n-type GaN containing Si as n-type impurities, and the p-type contact layer comprises by a p-type GaN containing Mg as p-type impurities.

Also, the present invention relates to:

(11) a nitride semiconductor laser according to the above-mentioned item (1), characterized in that the active layer has a multiple quantum well structure, its barrier layer comprises $Ga_{1-y1}In_{y1}N$ (1>y1>0), the cap layer comprises $Al_{x1}Ga_{1-x1}N$ (1>x1>0) and the stress concentration suppressing layer comprises $Al_xGa_{1-x-y}In_yN$ (1>x>0, 1>y>0, 1>x+y>0);

(12) a nitride semiconductor laser according to the above-mentioned item (11), characterized in that an atom composition ratio (x, y) of Al and In in the $Al_xGa_{1-x-y}In_yN$ (1>x>0, 1>y>0, 1>x+y>0) constituting the stress concentration suppressing layer is made graded from (0, y1) (the y1 indicates an atom composition ratio of In in the $Ga_{1-y1}In_{y1}N$ constituting the barrier layer, and satisfies (1>y1>0)) to (x1, 0) (the x1 indicates an atom composition ratio of Al in the $Al_{x1}Ga_{1-x1}N$ constituting the cap layer, and satisfies (1>x1>0)), from the active layer side to the cap layer side;

(13) a nitride semiconductor laser according to the above-mentioned item (11), characterized in that the active layer is sandwiched between the p-type cladding layer and the n-type cladding layer, and the cap layer is sandwiched between the p-type cladding layer and the active layer; and

(14) a nitride semiconductor laser according to the above-mentioned item (13), characterized in that the n-type cladding layer comprises an n-type AlGaN mixed crystal containing Si as n-type impurities, and the p-type cladding layer comprises a p-type AlGaN mixed crystal containing Mg as p-type impurities.

Also, the present invention relates to:

(15) a nitride semiconductor laser according to the above-mentioned item (13), characterized in that an n-type optical guiding layer is further formed between the active layer and the n-type cladding layer, and a p-type optical guiding layer is further formed between the p-type cladding layer and the cap layer;

(16) a nitride semiconductor laser according to the above-mentioned item (15), characterized in that the n-type optical guiding layer comprises an n-type GaN containing Si as n-type impurities, and the p-type optical guiding layer comprises a p-type GaN containing Mg as p-type impurities;

(17) a nitride semiconductor laser according to the above-mentioned item (15), characterized in that an n-type contact layer is further formed on a side opposite to the n-type optical guiding layer of the n-type cladding layer, and a p-type contact layer is further formed on a side opposite to the p-type optical guiding layer of the p-type cladding layer; and

(18) a nitride semiconductor laser according to the above-mentioned item (17), characterized in that the n-type contact layer comprises an n-type GaN containing Si as n-type impurities, and the p-type contact layer comprises a p-type GaN containing Mg as p-type impurities.

Also, the present invention relates to:

(19) a manufacturing method of a nitride semiconductor laser, characterized by including a step of growing a stress concentration suppression layer on an active layer and a step of growing a cap layer on the stress concentration suppressing layer;

(20) a manufacturing method of a nitride semiconductor laser according to the above-mentioned item (19), characterized in that the stress concentration suppressing layer has a function of relaxing a change in a band gap between the active layer and the cap layer;

(21) a manufacturing method of a nitride semiconductor laser according to the above-mentioned item (19), characterized in that the stress concentration suppressing layer has, on an active layer side, a composition identical to that of the active layer, and on a cap layer side, a composition identical to that of the cap layer, and the composition of the stress concentration suppressing layer is made graded to the cap layer side from the active layer side; and

(22) a manufacturing method of a nitride semiconductor laser according to the above-mentioned item (21), characterized in that the composition on the active layer side of the stress concentration suppressing layer has a composition identical to that of a barrier layer of an active layer having a multiple quantum well structure.

Also, the present invention relates to:

(23) a manufacturing method of a nitride semiconductor laser according to the above-mentioned item (19), characterized in that it further includes a step of growing the active layer on an n-type cladding layer and a step of growing a p-type cladding layer on the cap layer, and a band gap of the active layer is smaller than band gaps of the n-type and p-type cladding layers, and a band gap of the cap layer is larger than the band gap of the p-type cladding layer;

(24) a manufacturing method of a nitride semiconductor laser according to the above-mentioned item (23), characterized in that the n-type cladding layer comprises an n-type AlGaN mixed crystal containing Si as n-type impurities, and the p-type cladding layer comprises a p-type AlGaN mixed crystal containing Mg as p-type impurities;

(25) a manufacturing method of a nitride semiconductor laser according to the above-mentioned item (19), characterized in that it includes a step of growing an n-type optical guiding layer on an n-type cladding layer, a step of growing the active layer on the n-type optical guiding layer, a step of growing a p-type optical guiding layer on the cap layer, and a step of growing a p-type cladding layer on the p-type optical guiding layer;

(26) a-manufacturing method of a nitride semiconductor laser according to the above-mentioned item (25), characterized in that the n-type optical guiding layer comprises an n-type GaN containing Si as n-type impurities, and the p-type optical guiding layer comprises a p-type GaN containing Mg as p-type impurities;

(27) a manufacturing method of a nitride semiconductor laser according to the above-mentioned item (25), characterized in that it further includes a step of growing the n-type cladding layer on an n-type contact layer and a step of growing a p-type contact layer on the p-type cladding layer; and

(28) a manufacturing method of a nitride semiconductor laser according to the above-mentioned item (27), characterized in that the n-type contact layer comprises an n-type GaN containing Si as n-type impurities, and the p-type contact layer comprises a p-type GaN containing Mg as p-type impurities.

Also, the present invention relates to:

(29) a manufacturing method of a nitride semiconductor laser according to the above-mentioned item (19), characterized in that the active layer has a multiple quantum well structure, its barrier layer comprises $Ga_{1-y1}In_{y1}N$ (1>y1>0), the cap layer comprises $Al_{x1}Ga_{1-x1}N$ (1>x1>0) and the stress concentration suppressing layer comprises $Al_xGa_{1-x-y}In_yN$ (1>x>0, 1>y>0, 1>x+y>0);

(30) a manufacturing method of a nitride semiconductor laser according to the above-mentioned item (29), characterized in that an atom composition ratio (x, y) of Al and In in the $Al_xGa_{1-x-y}In_yN$ (1>x>0, 1>y>0, 1>x+y>0) constituting the stress concentration suppression layer is made graded from (0, y1) (the y1 indicates an atom composition ratio of In in the $Ga_{1-y1}In_{y1}N$ constituting the barrier layer, and satisfies (1>y1>0)) to (x1, 0) (the x1 indicates an atom composition ratio of Al in the $Al_{x1}Ga_{1-x1}N$ constituting the cap layer, and satisfies (1>x1>0)), from the active layer side to the cap layer side;

(31) a manufacturing method of a nitride semiconductor laser according to the above-mentioned item (29), characterized in that it further includes a step of growing the active layer on an n-type cladding layer and a step of growing a p-type cladding layer on the cap layer; and

(32) a manufacturing method of a nitride semiconductor laser according to the above-mentioned item (31), characterized in that the n-type cladding layer comprises an n-type AlGaN mixed crystal containing Si as n-type impurities, and the p-type cladding layer comprises a p-type AlGaN mixed crystal containing Mg as p-type impurities.

Also, the present invention relates to:

(33) a manufacturing method of a nitride semiconductor laser according to the above-mentioned item (29), characterized in that it includes a step of growing an n-type optical guiding layer on an n-type cladding layer, a step of growing the active layer on the n-type optical guiding layer, a step of growing a p-type optical guiding layer on the cap layer, and a step of growing a p-type cladding layer on the p-type optical guiding layer;

(34) a manufacturing method of a nitride semiconductor laser according to the above-mentioned item (33), characterized in that the n-type optical guiding layer comprises an n-type GaN containing Si as n-type impurities, and the p-type optical guiding layer comprises a p-type GaN containing Mg as p-type impurities;

(35) a manufacturing method of a nitride semiconductor laser according to the above-mentioned item (33), characterized in that it includes a step of growing the n-type cladding layer on an n-type contact layer and a step of further growing a p-type contact layer on the p-type cladding layer; and

(36) a manufacturing method of a nitride semiconductor laser according to the above-mentioned item (35), characterized in that the n-type contact layer comprises an n-type GaN containing Si as n-type impurities, and the p-type contact layer comprises a p-type GaN containing Mg as p-type impurities.

BRIEF DESCRIPTION OF DRAWINGS

FIG. 4A is a diagrammatic view of a band structure in the vicinity of an active layer of the conventional nitride semiconductor laser. FIGS. 4B and 4C are diagrammatic views of a band structure in the vicinity of an active layer of a nitride semiconductor laser according to the present invention.

DETAILED DESCRIPTION OF THE PRESENTLY PREFERRED EMBODIMENTS

Figure 1:
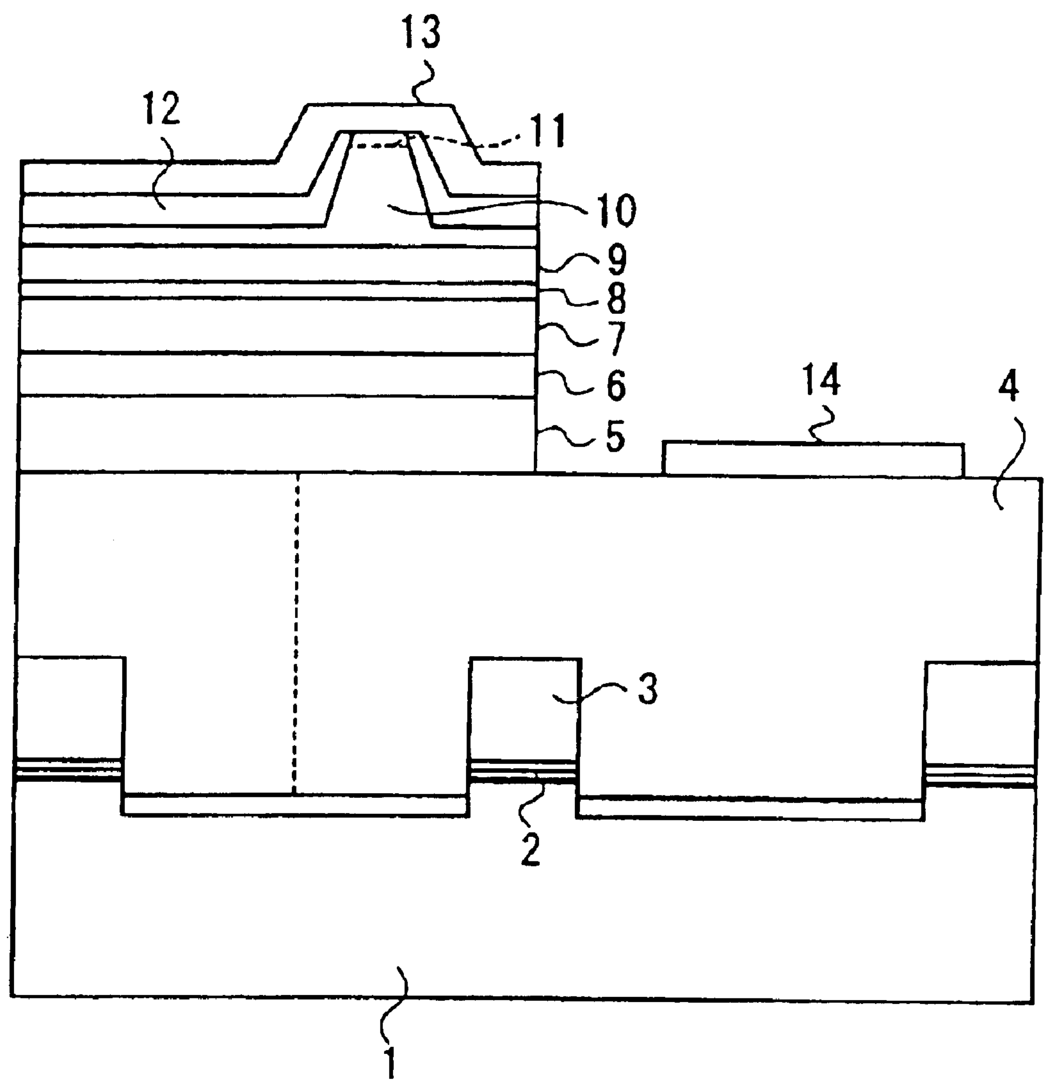
FIG. 1 is a sectional diagrammatic view of a conventional nitride semiconductor laser.
Figure 2:
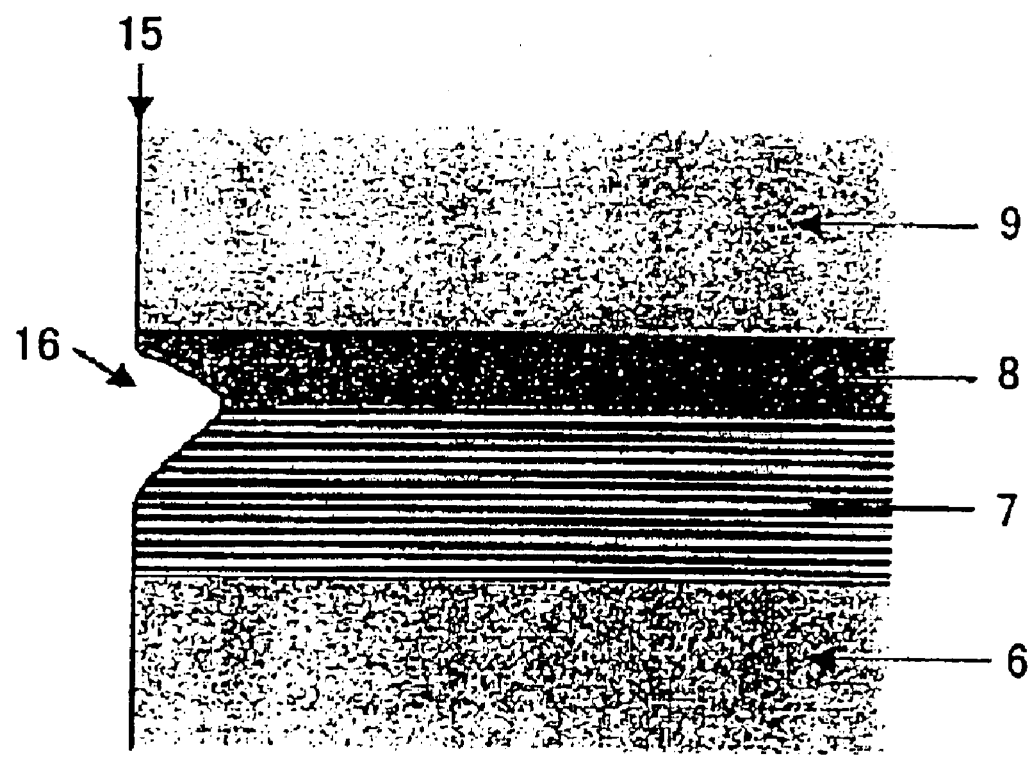
FIG. 2 is a diagrammatic view showing a condition of an end face breakdown in a conventional nitride semiconductor laser after degradation. Incidentally, the figure shows a cross-section parallel to a stripe direction on a laser end face.
Figure 3:
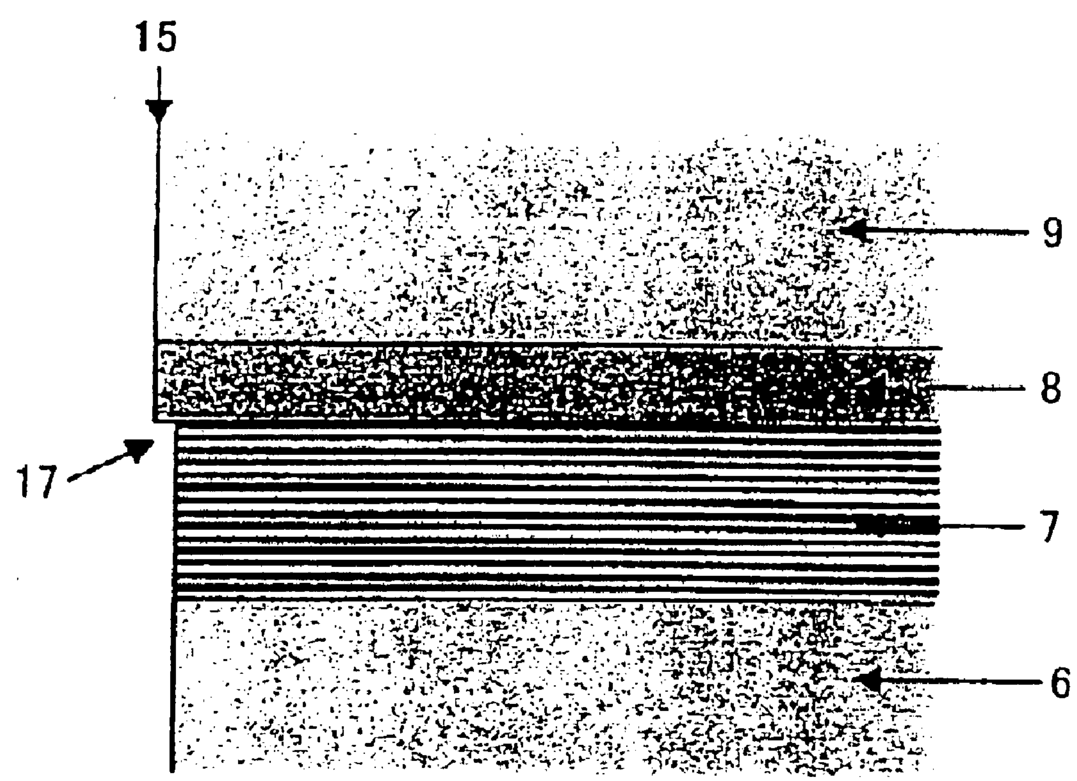
FIG. 3 is a diagrammatic view showing a condition of and end face at a time of a cleavage in the conventional nitride semiconductor laser. Incidentally, the figure shows the cross-section parallel to the stripe direction on the laser end face.

In the present invention, the nitride semiconductor laser implies the semiconductor laser provided with nitride semiconductors. Here, the nitride semiconductor is basically assumed to include the semiconductors of all compositions in which composition ratios x, y and z in a chemical formula of $In_xAl_yGa_zN$ (x, y, z≦1, x+y+z=1) are changed within the respective ranges. For example. even InGaN (x=0.4, y=0, z=0.6) is included in the "Nitride Semiconductor". Moreover, it includes a material in which a part of In, Al and Ga that belong to a group III element is replaced with B (boron) and a material in which a part of N that belongs to a group V element is replaced with P (phosphorus). At this time, the group III element includes any one of the above-mentioned three elements (In, Al and Ga), and the group V element always includes N (nitrogen). By the way, the above-mentioned GaN-based semiconductor is a concept included in the nitride semiconductor.

The nitride semiconductor laser in the present invention is characterized by having a stress concentration suppressing layer between an active layer and a cap layer. The inclusion of the stress concentration suppressing layer enables the suppression of the stress concentration caused by the lattice mismatching between the active layer and the cap layer. Actually, in the stress concentration suppressing layer, the relaxation of the change in the band gap between the active layer and the cap layer enables the suppression of the stress concentration caused by the lattice mismatching between the active layer and the cap layer.

As the preferable embodiment of the nitride semiconductor laser in the present invention, a nitride semiconductor laser is listed in which it has a stress concentration suppression layer between an active layer and a cap layer, and the stress concentration suppressing layer has, on the active layer, a composition equal to the composition of the active layer, and it has, on the cap layer side, a composition equal to the composition of the cap layer, and the composition of the stress concentration suppressing layer is made graded from the active layer side to the cap layer side, namely, smoothly changed. As mentioned above, by smoothly changing the composition of the stress concentration suppressing layer from the active layer side to the cap layer, the change of the band gap to the cap layer from the active layer can be relaxed to thereby suppress the stress concentration caused by the lattice mismatching between the active layer and the cap layer.

Here, the active layer may have any of the known structures. However, if the active layer has the multiple quantum well structure, in the above-mentioned embodiment, a composition of the active layer side of the stress concentration suppressing layer is desired to be equal to a composition of a barrier layer of the active layer.

If the nitride semiconductor laser according to the present invention has the above-mentioned characteristic feature, it may have a known additional structure used in the technical field.

For example, one embodiment of the nitride semiconductor laser in the present invention includes a semiconductor laser provided with a p-type cladding layer and an n-type cladding, having an active layer of a band gap smaller than those cladding layers between the n-type and p-type cladding layers, a cap layer of a band gap larger than the p-type clad layer between the p-type clad layer and the active layer, and a stress concentration suppressing layer having a function of relaxing the change of the band gap between the active layer and the cap layer between the active layer and the cap layer. Here, the p-type cladding layer is desired to be composed of nitride semiconductors containing p-type impurities, for example, Mg and the like. Also, the n-type cladding layer is desired to be composed of nitride semiconductors containing n-type impurities, for example, Si and the like.

Another embodiment of the nitride semiconductor laser in the present invention includes, for example, a nitride semiconductor laser in which a p-type optical guiding layer is further formed between the p-type cladding layer and the cap layer, and an n-type optical guiding layer is further formed between the active layer and the n-type cladding layer, in the above-mentioned embodiment.

At this time, preferably, a band gap of the p-type optical guiding layer is smaller than a band gap of the p-type cladding layer, and a band gap of the n-type optical guiding layer is smaller than a band gap of the n-type cladding layer, and the above-mentioned band gaps of the n-type and p-type optical guiding layers are larger than a band gap of the active layer. Also, the p-type optical guiding layer is desired to be composed of the nitride semiconductors containing the p-type impurities, for example, Mg and the like, and the n-type optical guiding layer is desired to be composed of the nitride semiconductors containing the n-type impurities, for example, Si and the like.

In the nitride semiconductor laser of the above-mentioned embodiment, a p-type contact layer may be further formed on a side opposite to the p-type optical guiding layer of the p-type cladding layer, and an n-type contact layer may be further formed on a side opposite to the n-type optical guiding layer of the n-type cladding layer. Here, the p-type contact layer is desired to be composed of the nitride semiconductors containing the p-type impurities, for example, Mg and the like. Also, the n-type contact layer is desired to be composed of the nitride semiconductors containing the n-type impurities, for example, Si and the like.

A preferable embodiment of the nitride semiconductor laser according to the present invention includes a nitride semiconductor laser in which it has: an active layer of a multiple quantum well structure having a barrier layer constituted by $Ga_{1-y1}In_{y1}N$ (1>y1>0); a cap layer constituted by $Al_{x1}Ga_{1-x1}N$ (1>x1>0); and a stress concentration suppressing layer constituted by $Al_xGa_{1-x-y}In_yN$ (1>x>0, 1>y>0, 1>x+y>0) between the active layer and the cap layer.

In the nitride semiconductor laser of the above-mentioned embodiment, an atom composition ratio (x, y) between Al and In of the $Al_xGa_{1-x-y}In_yN$ constituting the stress concentration suppressing layer is desired to be graded from (0, y1) to (x1, 0), from the active layer side to the cap layer side, namely, smoothly changed. By the way, the y1 implies the atom composition ratio of In in the $Ga_{1-y1}In_{y1}N$ constituting the barrier layer, and the x1 implies the atom composition ratio of Al in the $Al_{x1}Ga_{1-x1}N$ constituting the cap layer.

Figure 6:
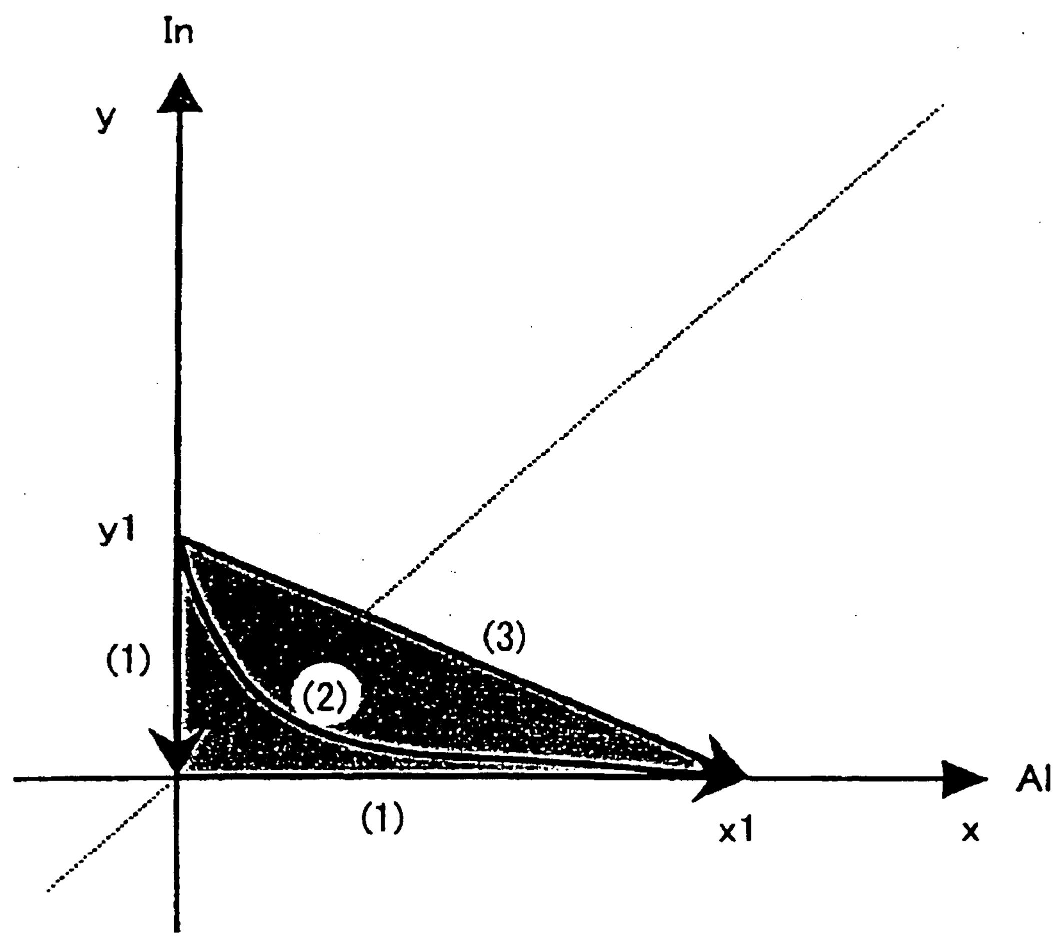
FIG. 6 is a view showing a graded range and an grading method of a composition of a stress concentration suppressing layer in the nitride semiconductor laser according to the present invention.

This is described in detail with reference to FIG. 6. Preferably, (x, y) is (0, y1) on a boundary between the stress concentration suppressing layer and the active layer, and it is (x1, 0) on a boundary between the stress concentration suppressing layer and the cap layer, and it further leads to the (x1, 0) from the (0, y1) via a blackly painted region of FIG. 6 within the stress concentration suppressing layer. At this time, the composition of the stress concentration suppression layer is desired to be smoothly changed within the layer. In particular, a preferable example includes a case where the inclination of the locus of the (x, y) to the (x1, 0) from the (0, y1) is desired to be always minus, and a more preferable example includes a case where the (x, y) draws in accordance with the locus from (1) to (3) of FIG. 6.

In the above-mentioned nitride semiconductor laser of the preferable embodiment according to the present invention, if it has the above-mentioned characteristic features, it may have a known additional structure used in the technical field.

A more specific embodiment of the nitride semiconductor laser of the above-mentioned preferable embodiment includes, for example, a semiconductor laser in which a lamination structure composed of the active layer, the stress concentration suppressing layer and the cap layer as mentioned above is sandwiched between the n-type cladding layer and the p-type cladding layer. That is, there may be included a semiconductor laser in which the active layer is formed on the n-type cladding layer, the stress concentration suppressing layer is formed on the active layer, the cap layer is formed on the stress concentration suppressing layer, and the p-type cladding layer is formed on the cap layer. Here, the compositions of the p-type cladding layer and the n-type cladding layer are not especially limited. However, the n-type cladding layer is desired to be constituted by n-type AlGaN mixed crystals to which Si as the n-type impurity is added, and the p-type cladding layer is desired to comprise p-type AlGaN compound crystals to which Mg as the p-type impurity is added.

In the above-mentioned actual embodiment, a p-type optical guiding layer may be further formed between the p-type cladding layer and the cap layer, and an n-type optical guiding layer may be further formed between the active layer and the n-type cladding layer. Moreover, a p-type contact layer may be further formed on a side opposite to the p-type optical guiding layer of the p-type cladding layer, and an n-type contact layer may be further formed on a side opposite to the n-type optical guiding layer of the n-type cladding layer.

Here, the compositions of the above-mentioned respective layers are not especially limited. However, the n-type optical guiding layer is desired to be composed of the n-type GaN to which Si as the n-type impurity is added, and the p-type optical guiding layer is desired to be composed of the p-type GaN to which Mg as the p-type impurity is added. Also, the n-type contact layer is desired to be composed of the n-type GaN to which Si as the n-type impurity is added, and the p-type contact layer is desired to be composed of the p-type GaN to which Mg as the p-type impurity is added.

A manufacturing method of a nitride semiconductor laser according to the present invention may be based on a known method. In particular, the nitride semiconductor laser according to the present invention can be manufactured by sequentially combining the processes for growing the nitride semiconductor layers constituting the nitride semiconductor laser, under a condition that a lateral direction growth is generated.

The method of growing the nitride semiconductor layers constituting the nitride semiconductor laser according to the present invention is not especially limited. For example, it may use a known method, such as a metal organic chemical vapor deposition (MOCVD) method, a halide vapor phase epitaxy or a molecular beam epitaxy (MBE) method or the like.

The further specific embodiment of the nitride semiconductor laser according to the present invention will be described below in detail with reference to the attached drawings.

Figure 5:
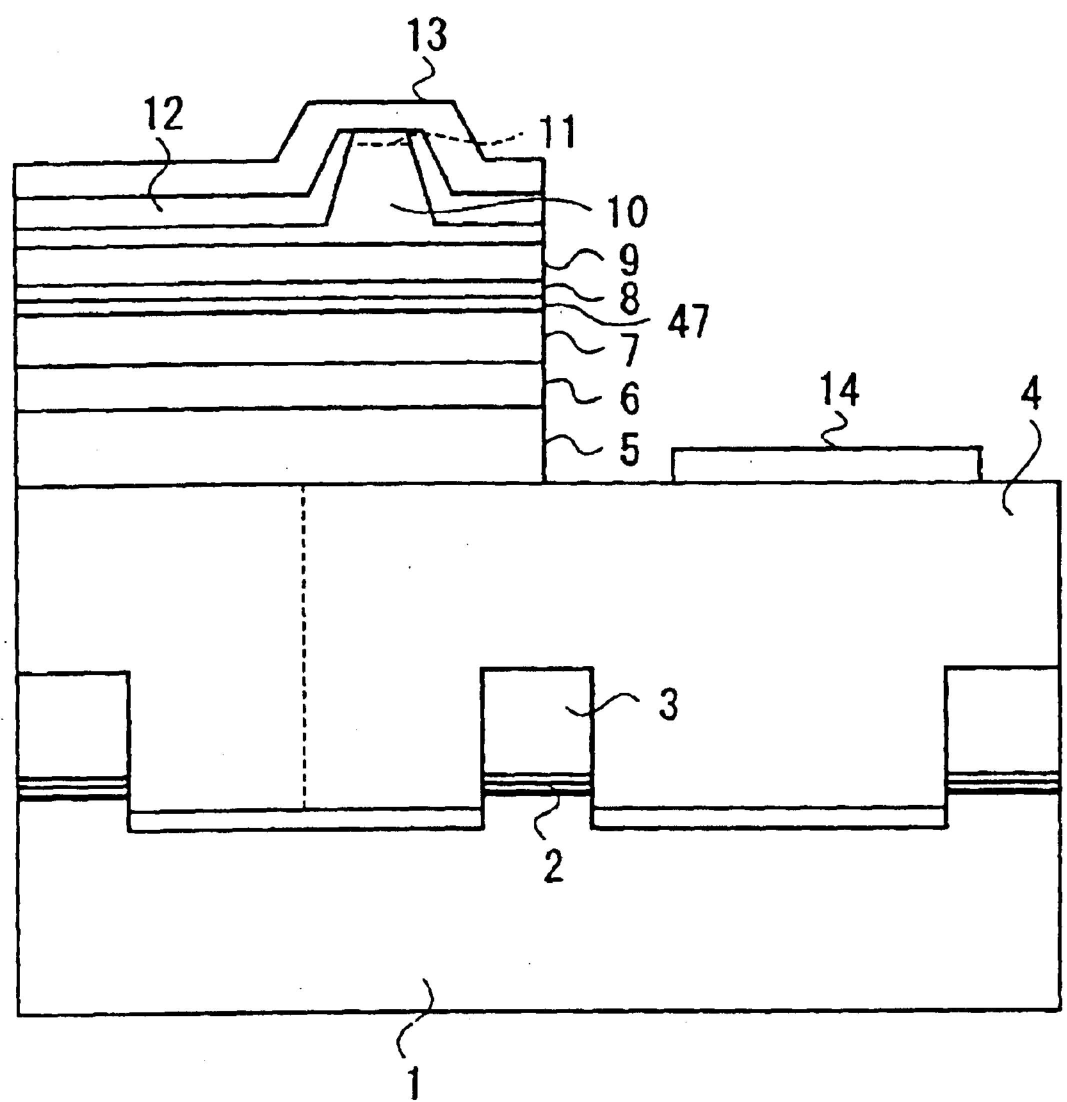
FIG. 5 is a diagrammatic view of a cross-section vertical to a resonator length direction of the nitride semiconductor laser according to the present invention.

FIG. 5 is a cross-sectional view showing the configuration of the nitride semiconductor laser according to the actual embodiment of the present invention. Although a substrate 1 includes a sappier substrate, SiC, Si, GaAs, spinel or ZnO or the like, it is desirable to use the sappier substrate in which a c plane is centrally used. A first GaN layer 3 having a thickness of about 1 to 5 μm, preferably, about 1 to 3 μm is laminated on the substrate 1 through a buffer layer 2 composed of a nitride semiconductor (for example, GaN, AlN or InGaN or the like) having a lamination direction thickness (hereafter, merely referred to as a thickness) of about 30 nm. As the buffer layer 2, an undoped GaN layer is especially desired. Also, the first GaN layer 3 may be an undoped GaN layer or a GaN layer on which impurities are doped, for example, an n-type GaN layer on which n-type impurities such as Si and the like are doped. However, the undoped GaN layer is especially desired.

The substrate 1, the buffer layer 2 and a part of the first GaN layer are removed, for example, in a shape of stripes, and a second GaN layer 4 is laminated thereon by the ELO method, as shown in FIG. 5. The second GaN layer 4 is composed of n-type GaN to which Si as an n-type impurity is added, and it has a role as an n-type cladding layer.

An n-type cladding layer 5, an n-type optical guiding layer 6, an active layer 7, a stress concentration suppressing layer 47, a cap layer 8, a p-type optical guiding layer 9, a p-type cladding layer 10 and a p-type contact layer 11, which act as the nitride semiconductor layers, are sequentially laminated on this second GaN layer 4.

The n-type cladding layer 5 has a thickness of about 1 μm, and it comprises an n-type AlGaN mixed crystal to which Si as an n-type impurity is added. The n-type optical guiding layer 6 has a thickness of about 0.1 μm, and it comprises an n-type GaN to which Si as an n-type impurity is added. The active layer 7 comprises the GaInN mixed crystal having the multiple quantum well (MQW) structure in which a thickness of a well is about 3 nm and a thickness of a barrier layer is about 4 nm. The stress concentration suppressing layer 47 comprises an AlGaInN mixed crystal in which the composition is gradually graded. The cap layer 8 is provided in order to protect the active layer 7 from being deteriorated when the upper structure containing the p-type optical guiding layer is formed on the active layer 7. It comprises the AlGaN mixed crystal having a thickness of about 20 nm.

The p-type optical guiding layer 9 has a thickness of about 0.1 μm, and it comprises a p-type GaN to which Mg as a p-type impurity is added. The p-type cladding layer 10 has a thickness of about 0.5 μm, and it comprises a p-type AlGaN mixed crystal to which Mg as a p-type impurity is added. Also, the p-type cladding layer 10 may comprise a super lattice structure composed of an AlGaN layer and a GaN layer. The p-type contact layer 11 has a thickness of about 0.1 μm, and it comprises a p-type GaN to which Mg as a p-type impurity is added. The upper portion of the p-type cladding layer 10 and the p-type contact layer 11 may be processed as the upper mesa structure whose cross-sectional shape is tapered and striped in order to attain a current confinement.

Together with an insulating layer 12 made of insulating material such as silicon oxide ($SiO_2$) and the like, a p-side electrode 13 is formed on the p-type contact layer 11 through an opening formed on the insulating layer 12. The p-side electrode 13 is configured such that palladium (Pd), platinum (Pt) and gold (Au) are sequentially laminated from the side of the p-type contact layer 11. By the way, this p-side electrode 13 is formed in a shape of a slender band (a shape of a band extended in a direction vertical to the drawing in FIG. 5) in order to attain the current confinement. Also, an n-side electrode 14 in which titanium (Ti), aluminum (Al) and gold (Au) are sequentially laminated is formed on the second GaN layer 4.

In this nitride semiconductor laser, although they are not shown, reflection mirror layers are formed on a pair of sides vertical to a length direction (namely, a resonator length direction of the p-side electrode 13, respectively.

The manufacturing method of the above-mentioned nitride semiconductor laser will be described below. The above-mentioned manufacturing method is one of the specific embodiments of the manufacturing method of the nitride semiconductor laser according to the present invention.

This manufacturing method carries out a known pretreatment, such as an operation for washing a surface of the substrate 1 through a thermal cleaning and the like, depending on a desire. The buffer layer 2 is grown on the substrate 1 by the MOCVD method. A growth temperature of the buffer layer 2 is desired to be a temperature lower than a growth temperature of the first GaN layer 3 as described later, specifically, a temperature of about 520° C.

After that, the first GaN layer 3 is grown on the buffer layer 2 by the MOCVD method. The growth temperature of the first GaN layer 3 is not especially limited. However, it is properly set such that a concave convex structure shown if FIG. 5 can be formed. Since a cycle of the concave convex structure is desired to be about 3 to 25 μm, it is desirable to form the first GaN layer 3 at a film thickness of about 1 to 5 μm.

After that, the substrate is taken away from an MOCVD apparatus. A mask formation film for a protective film mask formation is formed on the first GaN layer 3, and it is patterned to thereby form a protective film mask (not shown) of a predetermined pattern.

In order to form the protective film mask having the predetermined pattern, at first, for example, the technique such as a CVD method, a deposition method, a sputtering method or the like is used to form the mask formation film on the first GaN layer 3 and then form a resist film on the mask formation film. In succession, the predetermined pattern is exposed and developed to thereby form a resist pattern to which the pattern is transferred. By etching the mask formation film using the formed resist pattern, it is possible to form the protective film mask having the predetermined pattern.

When the protective film mask of the predetermined pattern is formed in the above-mentioned process, the pattern is not especially limited if it is shaped such that a part of the first GaN layer corresponding to the concave portion of the formed concave convex structure is exposed. For example, the shapes of stripes, zigzags, dots, grids and the like are included. In a case of the stripe-shaped pattern, for example, a stripe width is desired to be about 0.5 to 20 μm, and a stripe interval is desired to be about 1 to 25 μm. Also, a thickness of the protective film is not especially limited. However, it is desirable to be about 1 μm or less in view of the easiness of the process.

Also, the material of the mask formation film is not especially limited if it is the material having the property that disables the nitride semiconductor layer to be grown on the protective film or causes the growth to be difficult. For example, $SiO_x$, $SiN_x$, TiN, TiO, W and the like may be used.

In succession, the upper layer portion of the substrate and the first GaN layer exposed from the protective film mask are selectively etched and removed. After that, the protective film mask is removed. Then, the concave convex structure having the concave portion in which the substrate is exposed and the convex portion composed of the first GaN layer 3 and the upper portion of the substrate 1 is formed on the substrate surface.

At this step, when the upper layer portion of the substrate 1 and the first GaN layer 3 in the region in which the protective film mask is not formed, namely, the region exposed from the protective film mask are etched and removed, the etched amount of the substrate is desired to be about 2 μm or less, preferably, about 0.2 μm.

The cross-sectional shape of the convex portion formed by the etching may be tapered. However, it is desirable to be a vertical plane.

The etching method includes the methods such as a wet etching method, a dry etching method and the like. However, the dry etching method is desired. The dry etching method includes, in specific, a reactive ion dry etching (RIE) method, a reactive ion beam dry etching (RIBE) method, for example.

Again, the substrate is fed into the MOCVD apparatus and, under a condition that the lateral direction growth is generated, the n-type second GaN layer 4, the n-type cladding layer 5 composed of the n-type AlGaN, the n-type optical guiding layer 6 composed of the n-type GaN, the active layer 7, the stress concentration suppressing layer 47, the cap layer 8, the p-type optical guiding layer 9 composed of the p-type GaN, the p-type cladding layer 10 composed of the p-type AlGaN and the p-type contact layer 11 composed of the p-type GaN are sequentially laminated.

Here, the active layer 7 having the multiple quantum well structure in which a GaInN layer acts as a light emission layer is formed. Then, the stress concentration suppression layer 47, in which it is composed of an AlGaIn layer and its composition is graded, is formed. And, the p-type AlGaN cap layer 8 is formed thereon at a relatively low temperature. The In composition in the active layer constituted by the GaInN multiple quantum well structure is desired to be adjusted to, for example, about 0.08 in the well layer, and for example, about 0.02 in the barrier layer. Also, it is desirable to adjust the Al composition ratio in the cap layer composed of AlGaN to, for example, about 0.15. When the active layer and the cap layer are set in this way, in such a way that the atomic composition ratio (x, y) of Al and In in $Al_xGa_{1-x-y}In_yN$ of the stress concentration suppressing layer 47 has the value of (0, 0.02) equal to the composition of the barrier layer of the active layer, on the active layer side, and it has the value of (0.15, 0) equal to the composition of the cap layer, on the cap layer side, the stress concentration suppression layer 47 is grown.

As growing materials of those nitride semiconductor layers, it is desirable to use, for example, tri-methyl gallium ($(CH_3)_3Ga$: TMG) as a raw material of Ga of the group III element, tri-methyl aluminum ($(CH_3)_3Al$ : TMAl) as a raw material of Al of the group III element, tri-methyl indium ($(CH_3)_3In$ : TMIn) as a raw material of In of the group III element, and ammonium ($NH_3$) as a raw material of N of the group V element.

Also, as a carrier gas, it is desirable to use, for example, a mixture gas of hydrogen ($H_2$) and nitrogen ($N_2$).

As a dopant, it is desirable to use as an n-type dopant, for example, mono-silane, and as a p-type dopant, for example, bis=methyl-cyclo-pentadienyl-magnesium ($(CH_3C_5H_4)_2Mg$; $MeCp_2Mg$) or bis=cyclo-pentadienyl-magnesium ($(C_5H_5)_2Mg$; $Cp_2Mg$).

Next, the substrate on which the nitride semiconductor layer is grown is again taken away from the MOCVD apparatus. The insulating layer 12 made of $SiO_2$ is formed on the p-type contact layer 11 composed of the p-type GaN, for example, by the CVD method. Next, a resist film (not shown) is coated on the insulating layer 12, and a mask pattern corresponding to a formation position of a p-side electrode 13 is formed by a photo-lithography. After that, this is used to etch, and the insulating layer 12 is selectively removed, and an opening corresponding to the formation position of the p-side electrode 13 is formed.

In succession, for example, palladium (Pd), platinum (Pt) and gold (Au) are sequentially deposited on the entire surface (namely, on the p-type contact layer 11 made of the p-type GaN from which the insulating layer 12 is selectively removed and on the resist film (not shown)). Then, the resist film (not shown) together with the palladium, the platinum and the gold, which are deposited on this resist film, is removed (lifted off) to thereby form the p-side electrode 13.

After the formation of the p-side electrode 13, correspondingly to the formation position of the n-side electrode 14, the insulating layer 12, the p-type contact layer 11, the p-type cladding layer 10, the p-type optical guiding layer 9, the cap layer 8, the stress concentration suppressing layer 47, the active layer 7, the n-type optical guiding layer 6 and the n-type cladding layer 5 are removed sequentially and selectively. After that, titanium, aluminum and gold are selectively deposited on the second GaN layer 4, and the n-side electrode 14 is formed.

After the formation of the n-side electrode 14, the substrate 1 is cleaved at a predetermined width, vertically to the length direction (the resonator length direction) of the p-side electrode 13, and the reflection mirror layer is formed on the cleaved surface. Consequently, the nitride semiconductor laser according to the present invention is formed as shown in FIG. 5.

By the way, the above-mentioned manufacturing method has been described by limiting the growing method to the MOCVD method. However, it may be grown by using the other vapor phase growing methods, such as the halide vapor phase epitaxy or the molecular beam epitaxy (MBE) method or the like.

In the semiconductor laser according to the present invention, the introduction of the stress concentration suppressing layer-composed of the graded composition AlGaInN mixed crystal enables the suppression of the concentration of the stress in the boundary between the active layer and the cap layer (hereafter, referred to as the active layer/cap layer boundary). Thus, in the cleaving process required when the semiconductor laser is manufactured, the occurrence of the stage difference in the active layer/cap layer boundary can be suppressed on the cleaved end face. Also, in the case of the situation that the stress is concentrated in the active layer/cap layer boundary, in association with the thermal stress generation in the vicinity of the end face caused by the operation, the end face breakdown is progressed to thereby shorten the life of the semiconductor laser. However, in the semiconductor laser according to the present invention, the stress concentration in the active layer/cap layer boundary is suppressed to thereby enable the suppression of the progress of the end face breakdown. As a result, it is possible to prolong the life of the semiconductor laser.

What is claimed is:

1. A nitride semiconductor laser comprising:

an active layer;

a stress concentration suppressing layer disposed directly on the active layer without an intervening layer located between the stress concentration suppressing layer and the active layer; and a cap layer disposed directly on the stress concentration suppressing layer without an intervening layer located between the cap layer and the stress concentration suppressing layer, wherein the stress concentration suppressing layer has, on an active layer side, a composition identical to the active layer, and on a cap layer side, a composition identical to the cap layer, and wherein the composition of the stress concentration suppressing layer is graded to the cap layer side from the active layer side.

2. The nitride semiconductor laser according to claim 1, wherein the stress concentration suppressing layer effects relaxing a change in a band gap between the active layer and the cap layer.

3. The nitride semiconductor laser according to claim 1, wherein the composition on the active layer side of the stress concentration suppressing layer has a composition identical to a barrier layer of the active layer having a multiple quantum well structure.

4. The nitride semiconductor laser according to claim 1, wherein:

the active layer has a multiple quantum well structure;

a barrier layer of the active layer comprises $Ga_{1-y1}In_{y1}N$ (1>y1>0);

the cap layer comprises $Al_{x1}Ga_{1-x1}N$ (1>x1>0); and the stress concentration suppressing layer comprises $Al_xGa_{1-x-y}In_yN$ (1>x>0, 1>y>0, 1>x+y>0).

5. The nitride semiconductor laser according to claim 4, wherein an atom composition ratio (x, y) of Al and In in the $Al_xGa_{1-x-y}In_yN$ (1>x>0, 1>y>0, 1>x+y>0) included in the stress concentration suppressing layer is graded from (0, y1) (the y1 indicates an atom composition ratio of In in the $Ga_{1-y1}In_{y1}N$ included in the barrier layer, and satisfies (1>y1>0)) to (x1, 0) (the x1 indicates an atom composition ratio of Al in the $Al_{x1}Ga_{1-x1}N$ included in the cap layer, and satisfies (1>x1>0)), from the active layer side to the cap layer side.

6. The nitride semiconductor laser according to claim 2, comprising;

an n-type cladding layer on a side opposite to the stress concentration suppressing layer of the active layer; and a p-type cladding layer on a side opposite to the stress concentration suppression layer of the cap layer, and wherein:

a band gap of the active layer is smaller than band gaps of said n-type and p-type cladding layers; and a band gap of the cap layer is larger than the band gap of the p-type cladding layer.

7. The nitride semiconductor laser according to claim 6, wherein:

the n-type cladding layer comprises an n-type AlGaN mixed crystal containing Si as n-type impurities; and the p-type cladding layer comprises a p-type AlGaN mixed crystal containing Mg as p-type impurities.

8. The nitride semiconductor laser according to claim 6, wherein:

an n-type optical guiding layer is further formed between the active layer and the n-type cladding layer; and a p-type optical guiding layer is further formed between the p-type cladding layer and the cap layer.

9. The nitride semiconductor laser according to claim 8, wherein:

the n-type optical guiding layer comprises an n-type GaN containing Si as n-type impurities; and the p-type optical guiding layer comprises a p-type GaN containing Mg as p-type impurities.

10. The nitride semiconductor laser according to claim 8, wherein:

an n-type contact layer is further formed on a side opposite to the n-type optical guiding layer of the n-type cladding layer; and a p-type contact layer is further formed on a side opposite to the p-type optical guiding layer of the p-type cladding layer.

11. The nitride semiconductor laser according to claim 10, wherein:

the n-type contact layer comprises an n-type GaN containing Si as n-type impurities; and the p-type contact layer comprises a p-type GaN containing Mg as p-type impurities.

12. A manufacturing method of a nitride semiconductor laser, method comprising the steps of:

growing a stress concentration suppressing layer directly on an active layer without an intervening layer located between the stress concentration suppressing layer and the active layer; and growing a cap layer directly on the stress concentration suppressing layer without an intervening layer located between the cap layer and the stress concentration suppressing layer, wherein the stress concentration suppressing layer has, on an active layer side, a composition identical to the active layer, and on a cap layer side, a composition identical to the cap layer, and wherein the composition of the stress concentration suppressing layer is graded to the cap layer side from the active layer side.

13. The manufacturing method of a nitride semiconductor laser according to claim 12, wherein the stress concentration suppressing layer effects relaxing a change in a band gap between the active layer and the cap layer.

14. The manufacturing method of a nitride semiconductor laser according to claim 12, wherein the composition on the active layer side of the stress concentration suppressing layer has a composition identical to a barrier layer of the active layer having a multiple quantum well structure.

15. The manufacturing method of a nitride semiconductor laser according to claim 12, wherein:

the active layer has a multiple quantum well structure;

a barrier layer of the active layer comprises $Ga_{1-y1}In_{y1}N$ (1>y1>0);

the cap layer comprises $Al_{x1}Ga_{1-x1}N$ (1>x1>0); and the stress concentration suppressing layer comprises $Al_xGa_{1-x-y}In_yN$ (1>x>0, 1>y>0, 1>x+y>0).

16. The manufacturing method of a nitride semiconductor laser according to claim 15, wherein an atom composition ratio (x, y) of Al and In in the $Al_xGa_{1-x-y}In_yN$ (1>x>0, 1>y>0, 1>x+y>0) included in the stress concentration suppression layer is graded from (0, y1) (the y1 indicates an atom composition ratio of In in the $Ga_{1-y1}In_{y1}N$ constituting the barrier layer, and satisfies (1>y1>0)) to (x1, 0) (the x1 indicates an atom composition ratio of Al in the $Al_{x1}Ga_{1-x1}N$ constituting the cap layer, and satisfies (1>x1>0)), from the active layer side to the cap layer side.

17. The manufacturing method of a nitride semiconductor laser according to claim 12, comprising:

growing the active layer on an n-type cladding layer; and growing a p-type cladding layer on the cap layer, and wherein:

a band gap of the active layer is smaller than band gaps of said n-type and p-type cladding layers; and a band gap of the cap layer is larger than the band gap of the p-type cladding layer.

18. The manufacturing method of a nitride semiconductor laser according to claim 17, wherein:

the n-type cladding layer comprises an n-type AlGaN mixed crystal containing Si as n-type impurities; and the p-type cladding layer comprises a p-type AlGaN mixed crystal containing Mg as p-type impurities.

19. The manufacturing method of a nitride semiconductor laser according to claim 12, comprising:

growing an n-type optical guiding layer on an n-type cladding layer;

growing the active layer on the n-type optical guiding layer;

growing a p-type optical guiding layer on the cap layer; and growing a p-type cladding layer on the p-type optical guiding layer.

20. The manufacturing method of a nitride semiconductor laser according to claim 19, wherein:

the n-type optical guiding layer comprises n-type GaN containing Si as n-type impurities; and the p-type optical guiding layer comprises p-type GaN containing Mg as p-type impurities.

21. The manufacturing method of a nitride semiconductor laser according to claim 19, comprising:

growing the n-type cladding layer on an n-type contact layer; and growing a p-type contact layer on the p-type cladding layer.

22. The manufacturing method of a nitride semiconductor laser according to claim 21, wherein:

the n-type contact layer comprises an n-type GaN containing Si as n-type impurities; and the p-type contact layer comprises a p-type GaN containing Mg as p-type impurities.

* * * * *